United States Patent
Danno (10) Patent No.: US 12,349,422 B2
(45) Date of Patent: Jul. 1, 2025

(54) SEMICONDUCTOR DEVICE (71) Applicant: TOYOTA JIDOSHA KABUSHIKI KAISHA, Toyota (JP)

(72) Inventor: Katsunori Danno, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 647 days.

(21) Appl. No.: 17/679,390

(22) Filed: Feb. 24, 2022

(65) Prior Publication Data
US 2022/0320270 A1   Oct. 6, 2022

(30) Foreign Application Priority Data

Mar. 30, 2021   (JP) ................................ 2021-057363

(51) Int. Cl.
  *H10D 62/10*   (2025.01)
  *H10D 8/00*   (2025.01)
  (Continued)

(52) U.S. Cl.
CPC .......... *H10D 62/106* (2025.01); *H10D 8/422* (2025.01); *H10D 8/60* (2025.01); *H10D 62/80* (2025.01); *H10D 99/00* (2025.01)

(58) Field of Classification Search
CPC . H01L 29/47; H01L 29/872; H01L 29/66143; H01L 29/8613; H01L 29/0619; H10D 62/106; H10D 8/422; H10D 8/60
See application file for complete search history.

(56) References Cited

U.S. PATENT DOCUMENTS

| | | | | | |
|---|---|---|---|---|---|
| 4,641,174 | A | * | 2/1987 | Baliga | ................... H01L 29/872 257/283 |
| 4,982,260 | A | * | 1/1991 | Chang | ................. H01L 29/0619 257/656 |

(Continued)

FOREIGN PATENT DOCUMENTS

| | | | | |
|---|---|---|---|---|
| JP | 2006186134 A | * | 7/2006 | ........... H01L 29/872 |
| JP | 2017-50398 A | | 3/2017 | |
| JP | 2019-036593 A | | 3/2019 | |

OTHER PUBLICATIONS

American Institute of Physics, "Gallium oxide has an advantage over silicon in producing cheaper and smaller devices", https://phys.org/news/2018-02-gallium-oxide-advantage-silicon-cheaper.html, Feb. 6, 2018 (Year: 2018).*

(Continued)

*Primary Examiner* — Vincent Wall
(74) *Attorney, Agent, or Firm* — Sughrue Mion, PLLC (57) ABSTRACT

In a semiconductor device, p-type semiconductor layers are stacked on a first surface side of n-type gallium oxide semiconductor layer such that the p-type semiconductor layers are in contact with the n-type gallium oxide semiconductor layer; a first electrode layer is stacked on the first surface side of the n-type gallium oxide semiconductor layer such that the first electrode layer is in contact with the p-type semiconductor layers and is in contact with the n-type gallium oxide semiconductor layer in a portion where the p-type semiconductor layers are distant from each other; a second electrode layer is stacked on a second surface side of the n-type gallium oxide semiconductor layer such that the second electrode layer is in contact with the n-type gallium oxide semiconductor layer; and a shortest distance between two p-type semiconductor layers that are most adjacent to each other is 0.4 μm to 1.0 μm.

6 Claims, 8 Drawing Sheets

(51) Int. Cl.
    *H10D 8/60*         (2025.01)
    *H10D 62/80*      (2025.01)
    *H10D 99/00*      (2025.01)

(56) References Cited

U.S. PATENT DOCUMENTS

| | | | | |
|---|---|---|---|---|
| 5,365,102 | A * | 11/1994 | Mehrotra | H01L 29/8725 |
| | | | | 257/E29.338 |
| 6,313,482 | B1 * | 11/2001 | Baliga | H01L 29/1608 |
| | | | | 257/E29.313 |
| 2007/0272979 | A1 * | 11/2007 | Saito | H01L 29/0634 |
| | | | | 257/E29.328 |
| 2009/0289262 | A1 * | 11/2009 | Zhang | H01L 29/872 |
| | | | | 257/E21.057 |
| 2014/0048902 | A1 * | 2/2014 | Raj | H01L 29/2003 |
| | | | | 257/E29.338 |
| 2018/0358478 | A1 * | 12/2018 | Ren | H01L 29/66143 |
| 2019/0288124 | A1 * | 9/2019 | Bauer | H01L 29/8611 |
| 2020/0168711 | A1 * | 5/2020 | Sasaki | H01L 29/47 |
| 2021/0296512 | A1 * | 9/2021 | Song | H01L 29/6606 |
| 2022/0320270 | A1 * | 10/2022 | Danno | H01L 29/66969 |
| 2022/0393037 | A1 * | 12/2022 | Okigawa | H01L 29/872 |
| 2023/0327027 | A1 * | 10/2023 | Kim | H01L 29/2003 |
| | | | | 257/472 |

OTHER PUBLICATIONS

JP2006-186134 machine translation (Year: 2006).*

* cited by examiner

CENTER SIDE ← → PERIPHERAL SIDE

SEMICONDUCTOR DEVICE

CROSS-REFERENCE TO RELATED APPLICATION

This application claims priority to Japanese Patent Application No. 2021-057363 filed on Mar. 30, 2021, incorporated herein by reference in its entirety.

BACKGROUND

1. Technical Field

The present disclosure relates to a semiconductor device.

2. Description of Related Art

Japanese Unexamined Patent Application Publication No. 2019-36593 (JP 2019-36593 A) discloses a semiconductor device having a heterojunction between an n-type gallium oxide semiconductor and a p-type semiconductor, more specifically, a junction barrier Schottky (JBS) diode including an n-type gallium oxide semiconductor and a p-type semiconductor. JP 2019-36593 A describes that the width of a mesa-shaped portion having a trench structure in the n-type gallium oxide semiconductor is preferably 0.25 μm to 5 μm.

SUMMARY

For example, in the semiconductor device having a heterojunction between an n-type gallium oxide semiconductor and a p-type semiconductor as disclosed in JP 2019-36593 A, improvement of voltage resistance and reduction in resistance can be simultaneously achieved.

The present disclosure provides a semiconductor device capable of simultaneously achieving improvement of voltage resistance and reduction in resistance.

The present disclosure found that the semiconductor device can be provided with the following means.

Aspect 1

A semiconductor device including a first electrode layer, a plurality of p-type semiconductor layers, an n-type gallium oxide semiconductor layer, and a second electrode layer, in which:
  the p-type semiconductor layers are stacked on a first surface side of the n-type gallium oxide semiconductor layer such that the p-type semiconductor layers are in contact with the n-type gallium oxide semiconductor layer;
  the first electrode layer is stacked on the first surface side of the n-type gallium oxide semiconductor layer such that the first electrode layer is in contact with the p-type semiconductor layers and is in contact with the n-type gallium oxide semiconductor layer in a portion where the p-type semiconductor layers are distant from each other;
  the second electrode layer is stacked on a second surface side of the n-type gallium oxide semiconductor layer such that the second electrode layer is in contact with the n-type gallium oxide semiconductor layer; and
  a shortest distance between two p-type semiconductor layers that are most adjacent to each other among the p-type semiconductor layers is 0.4 μm to 1.0 μm.

Aspect 2

The semiconductor device according to Aspect 1, in which:
  the n-type gallium oxide semiconductor layer has a plurality of trench structures on a side where the p-type semiconductor layers are stacked;
  the p-type semiconductor layers include
    a first p-type semiconductor layer that is stacked in recessed portions of the trench structures to have a thickness less than a depth of the recessed portions and
    a second p-type semiconductor layer that is stacked on protrusion portions between the trench structures;
  the first p-type semiconductor layer and the second p-type semiconductor layer are most adjacent to each other; and
  the first electrode layer is stacked such that the first electrode layer in contact with the first p-type semiconductor layer and the second p-type semiconductor layer and is in contact with the n-type gallium oxide semiconductor layer on side surfaces of the trench structures.

Aspect 3

The semiconductor device according to Aspect 2, in which:
  a shortest distance between the first p-type semiconductor layer and the second p-type semiconductor layer adjacent to each other and a doping concentration in the n-type gallium oxide semiconductor layer are designed such that a first depletion layer and a second depletion layer that are formed in a state where a potential of the first electrode layer relative to the second electrode layer is 0 V are connected to each other, the first depletion layer being formed between the first p-type semiconductor layer and the n-type gallium oxide semiconductor layer, and the second depletion layer being formed between the second p-type semiconductor layer and the n-type gallium oxide semiconductor layer; and
  the second electrode layer is an ohmic electrode.

Aspect 4

The semiconductor device according to Aspect 2 or 3, further including a peripheral voltage withstanding structure including the trench structures, in which:
  the peripheral voltage withstanding structure includes
    a third p-type semiconductor layer that is stacked in the recessed portions of the trench structures to have a thickness less than the depth of the recessed portions and
    a fourth p-type semiconductor layer that is stacked on the protrusion portions between the trench structures; and
  the third p-type semiconductor layer and the fourth p-type semiconductor layer are most adjacent to each other.

Aspect 5

The semiconductor device according to Aspect 4, in which a plurality of the third p-type semiconductor layers include two or more third p-type semiconductor layers having different thicknesses.

Aspect 6

The semiconductor device according to Aspect 4, in which a shortest distance between the third p-type semiconductor layer and the fourth p-type semiconductor layer that are most adjacent to each other increases in a direction from a center side to an outer side of the semiconductor device.

Aspect 7

The semiconductor device according to any one of Aspects 1 to 6, in which the n-type gallium oxide semiconductor layer is a gallium oxide substrate having a doping concentration of $3 \times 10^{17}$ cm$^{-3}$ or more.

The present disclosure can provide a semiconductor device capable of simultaneously achieving improvement of voltage resistance and reduction in resistance.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Hereinafter, an embodiment of the present disclosure will be described in detail. The present disclosure is not limited to the following embodiment, and various modifications can be made within the scope of the present disclosure.

First Embodiment

A semiconductor device according to a first embodiment of the present disclosure includes a first electrode layer, a plurality of p-type semiconductor layers, an n-type gallium oxide semiconductor layer, and a second electrode layer, in which: the p-type semiconductor layers are stacked on a first surface side of the n-type gallium oxide semiconductor layer such that the p-type semiconductor layers are in contact with the n-type gallium oxide semiconductor layer; the first electrode layer is stacked on the first surface side of the n-type gallium oxide semiconductor layer such that the first electrode layer is in contact with the p-type semiconductor layers and is in contact with the n-type gallium oxide semiconductor layer in a portion where the p-type semiconductor layers are distant from each other; the second electrode layer is stacked on a second surface side of the n-type gallium oxide semiconductor layer such that the second electrode layer is in contact with the n-type gallium oxide semiconductor layer; and a shortest distance between two p-type semiconductor layers that are most adjacent to each other among the p-type semiconductor layers is 0.4 μm to 1.0 μm.

A principle where improvement of voltage resistance and reduction in resistance can be achieved simultaneously in the semiconductor device according to the first embodiment of the present disclosure is as follows although the semiconductor device is not limited to this principle.

Figure 1A:
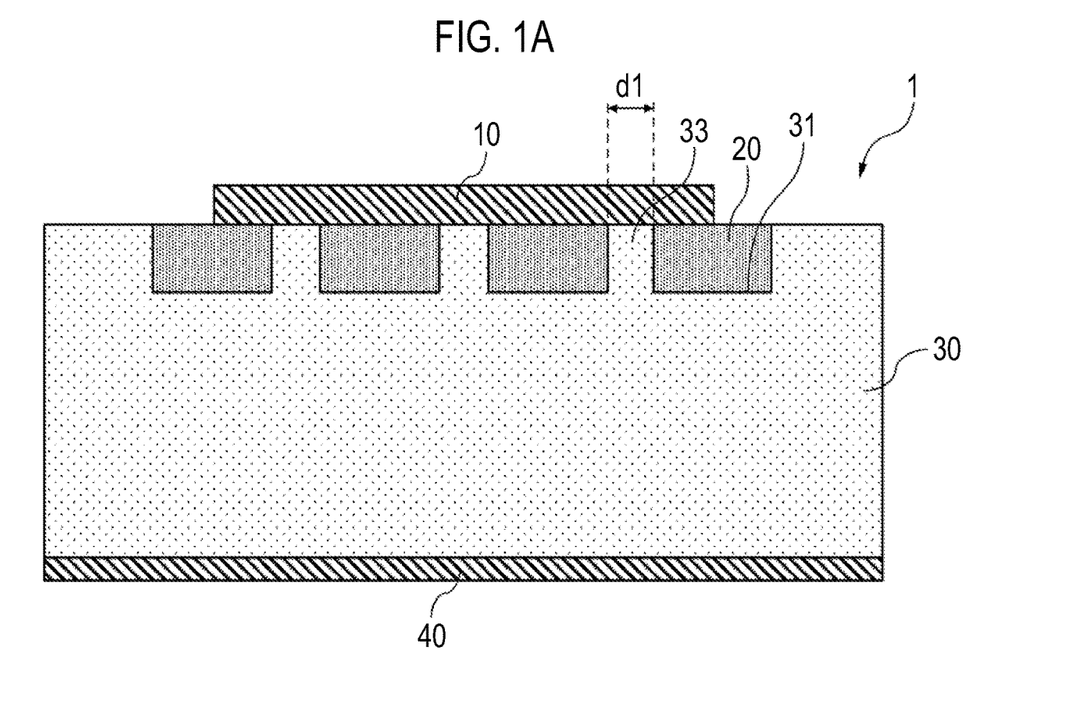
FIG. 1A is a schematic diagram illustrating a semiconductor device according to a first embodiment of the present disclosure.

Regarding a semiconductor device 1 illustrated in FIG. 1A, the simultaneous achievement of the improvement of voltage resistance and the reduction in resistance was investigated. The semiconductor device 1 includes a first electrode layer 10, a plurality of p-type semiconductor layers 20, an n-type gallium oxide semiconductor layer 30, and a second electrode layer 40, in which: the p-type semiconductor layers 20 are stacked on a first surface side of the n-type gallium oxide semiconductor layer 30 such that the p-type semiconductor layers 20 are in contact with the n-type gallium oxide semiconductor layer 30; the first electrode layer 10 is stacked on the first surface side of the n-type gallium oxide semiconductor layer 30 such that the first electrode layer 10 is in contact with the p-type semiconductor layers 20 and is in contact with the n-type gallium oxide semiconductor layer 30 in a portion where the p-type semiconductor layers 20 are distant from each other; and the second electrode layer 40 is stacked on a second surface side of the n-type gallium oxide semiconductor layer 30 such that the second electrode layer 40 is in contact with the n-type gallium oxide semiconductor layer 30.

In the semiconductor device 1 having the configuration, in order to improve the voltage resistance, a configuration of reducing a shortest distance d1 between two p-type semiconductor layers 20 that are most adjacent to each other among the p-type semiconductor layers 20 can be considered. However, as the distance decreases, the resistance of the semiconductor device 1 increases. That is, the improvement of voltage resistance and the reduction in resistance have a trade-off relationship.

Regarding this point, by setting the shortest distance between two p-type semiconductor layers 20 that are most adjacent to each other among the p-type semiconductor layers 20 to be 1.0 μm or less, in particular, the voltage resistance can be improved. However, when the shortest distance between two p-type semiconductor layers 20 that are most adjacent to each other among the p-type semiconductor layers 20 is less than 0.4 μm, the resistance decreases rapidly.

In the semiconductor device 1 according to the first embodiment of the present disclosure, the shortest distance d1 between two p-type semiconductor layers 20 that are most adjacent to each other among the p-type semiconductor layers 20 is 0.4 μm to 1.0 μm. Therefore, the improvement of voltage resistance and the reduction in resistance can be achieved simultaneously.

FIG. 1A is not intended to limit the semiconductor device according to the present disclosure.

First Electrode Layer

The first electrode layer is stacked on the first surface side of the n-type gallium oxide semiconductor layer such that the first electrode layer is in contact with the p-type semiconductor layers and is in contact with the n-type gallium oxide semiconductor layer in a portion where the p-type semiconductor layers are distant from each other.

The first electrode layer is in Schottky contact with the n-type gallium oxide semiconductor layer. In the first electrode layer, at least a portion in contact with the n-type gallium oxide semiconductor layer can be formed of any material that can come into Schottky contact with the n-type gallium oxide semiconductor layer, for example, a metal, such as Fe, Cu, Mo, or W.

P-Type Semiconductor Layer

The p-type semiconductor layers are stacked on a first surface side of the n-type gallium oxide semiconductor layer such that the p-type semiconductor layers are in contact with the n-type gallium oxide semiconductor layer. The p-type semiconductor layers are disposed to be distant from each other on the first surface side of the n-type gallium oxide semiconductor layer.

Examples of the material of the p-type semiconductor layer include $Ga_2O_3$, NiO, $CuO_2$, SnO, ZeSe, GaN, SiC, Si, and GaAs. However, the material is not limited to the examples.

The shortest distance between two p-type semiconductor layers that are most adjacent to each other among the p-type semiconductor layers is 0.4 μm to 1.0 μm.

The shortest distance between two p-type semiconductor layers that are most adjacent to each other among the p-type semiconductor layers may be 0.4 μm or more, 0.5 μm or more, 0.6 μm or more, or 0.7 μm or more and may be 1.0 μm or less, 0.9 μm or less, 0.8 μm or less, or 0.7 μm or less.

N-Type Gallium Oxide Semiconductor Layer

As the n-type gallium oxide semiconductor layer, a $Ga_2O_3$ single crystal substrate prepared using any method or a commercially available $Ga_2O_3$ single crystal substrate can be used. The $Ga_2O_3$ single crystal substrate may be α-$Ga_2O_3$ single crystal, β-$Ga_2O_3$ single crystal, or $Ga_2O_3$ single crystal having another crystal structure and is preferably β-$Ga_2O_3$ single crystal. The n-type gallium oxide semiconductor layer can be formed by doping the substrate with, for example, Si or Sn.

The n-type gallium oxide semiconductor layer may be a gallium oxide substrate having a doping concentration of $3 \times 10^{17}$ $cm^{-3}$ or more.

The doping concentration in the n-type gallium oxide semiconductor layer may be $3 \times 10^{17}$ $cm^{-3}$ to $9 \times 10^{18}$ $cm^{-3}$. The doping concentration in the n-type gallium oxide semiconductor layer may be $3 \times 10^{17}$ $cm^{-3}$ or more, $5 \times 10^{17}$ $cm^{-3}$ or more, $7 \times 10^{17}$ $cm^{-3}$ or more, or $9 \times 10^{17}$ $cm^{-3}$ or more, and may be $9 \times 10^{18}$ $cm^{-3}$ or less, $7 \times 10^{18}$ $cm^{-3}$ or less, $5 \times 10^{18}$ $cm^{-3}$ or less, or $3 \times 10^{18}$ $cm^{-3}$ or less.

Second Electrode Layer

The second electrode layer is stacked on a second surface side of the n-type gallium oxide semiconductor layer such that the second electrode layer is in contact with the n-type gallium oxide semiconductor layer.

The second electrode layer is in ohmic contact with the n-type gallium oxide semiconductor layer.

In the second electrode layer, at least a portion in contact with the n-type gallium oxide semiconductor layer can be formed of any material that can come into ohmic contact with the n-type gallium oxide semiconductor layer, for example, a metal, such as Ti. In addition, the second electrode layer may be in ohmic contact with the n-type gallium oxide semiconductor layer by performing a heat treatment on the electrode layer disposed on the n-type gallium oxide semiconductor layer.

Manufacturing Method

The semiconductor device according to the first embodiment of the present disclosure can be manufactured, for example, using a method illustrated in FIGS. 1B to 1F.

Figure 1B:
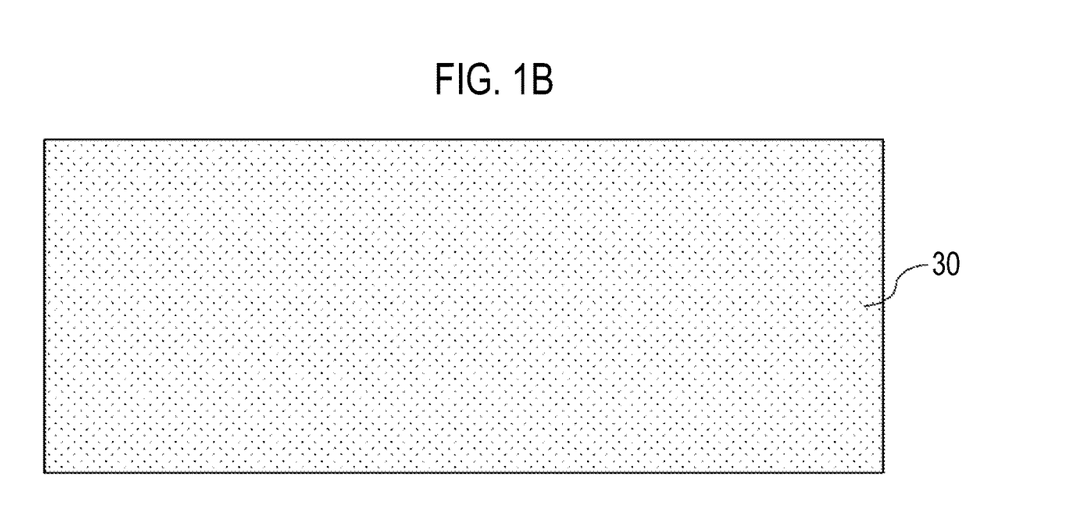
FIG. 1B is a schematic diagram illustrating an example of a step of manufacturing the semiconductor device according to the first embodiment of the present disclosure.
Figure 1C:
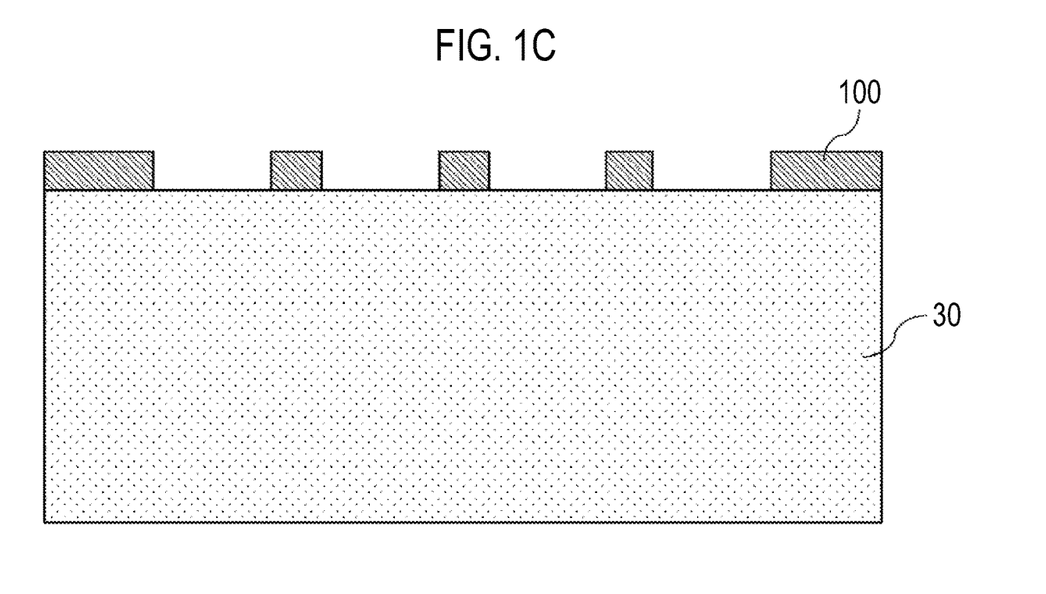
FIG. 1C is a schematic diagram illustrating an example of a step of manufacturing the semiconductor device according to the first embodiment of the present disclosure.
Figure 1D:
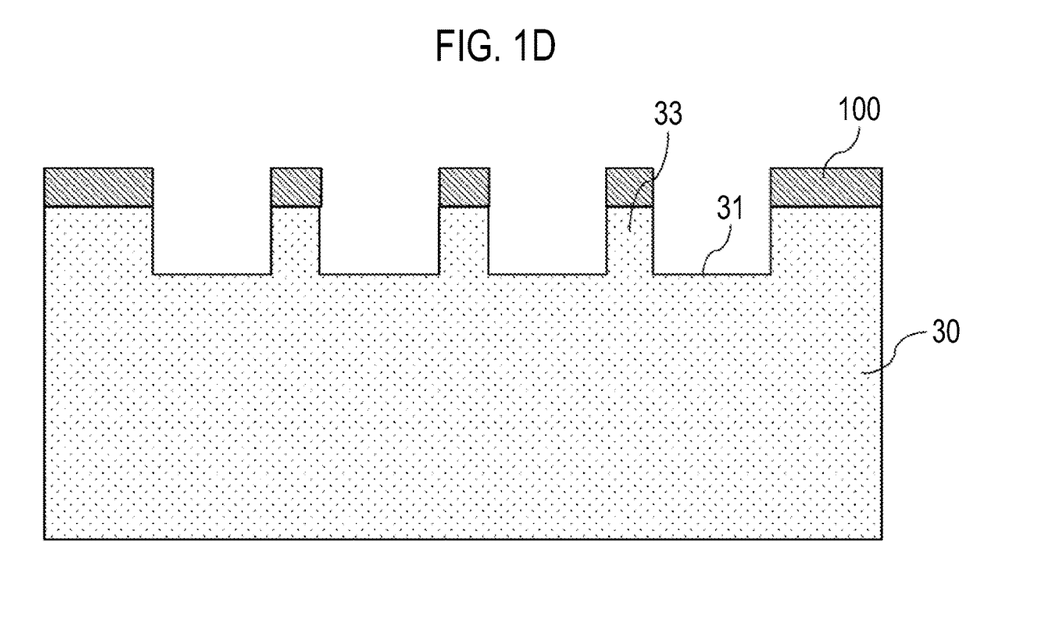
FIG. 1D is a schematic diagram illustrating an example of a step of manufacturing the semiconductor device according to the first embodiment of the present disclosure.
Figure 1E:
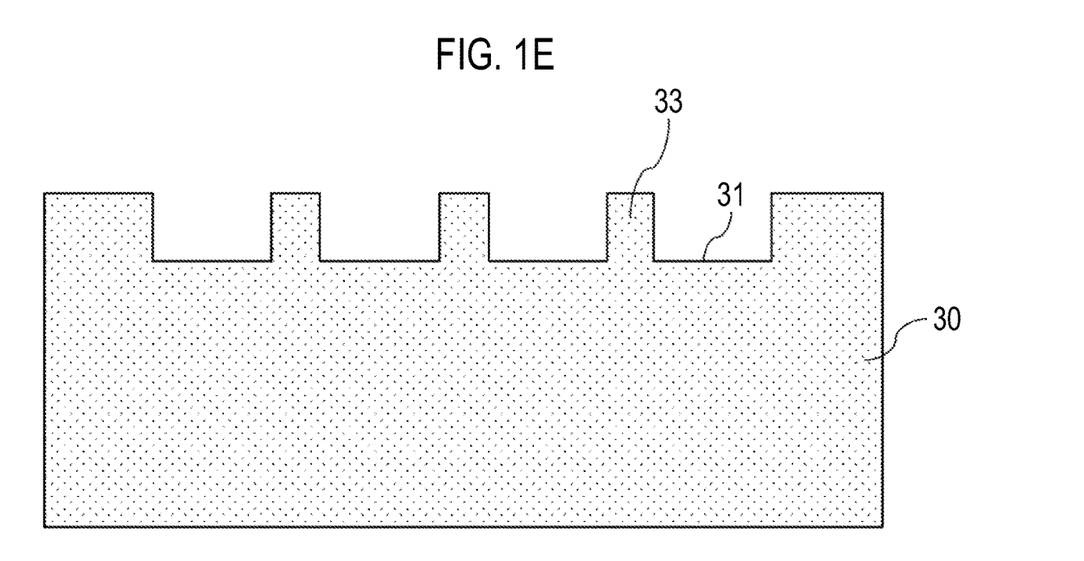
FIG. 1E is a schematic diagram illustrating an example of a step of manufacturing the semiconductor device according to the first embodiment of the present disclosure.
Figure 1F:
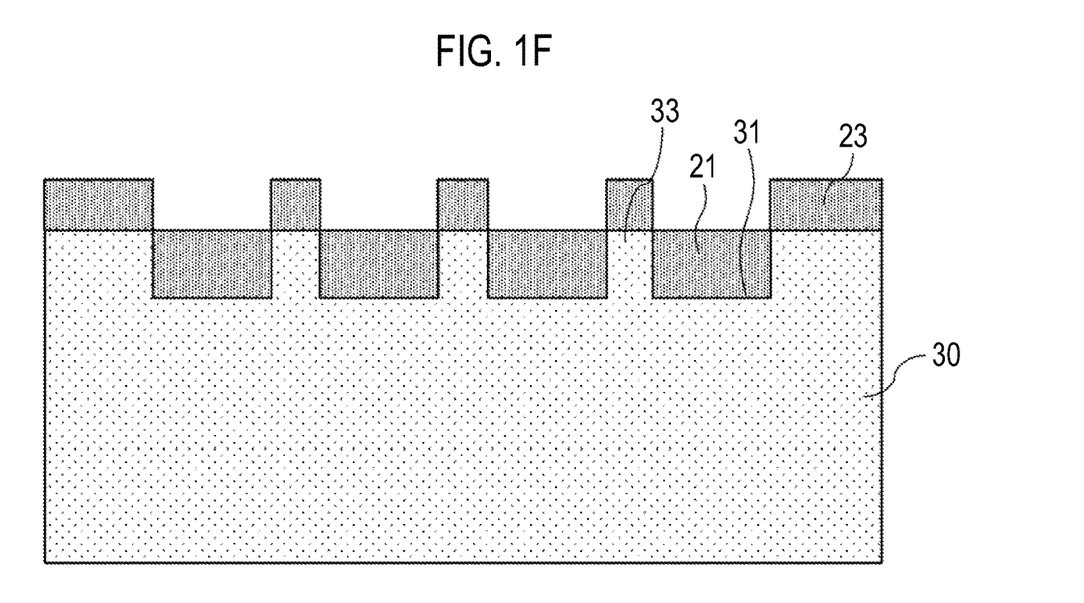
FIG. 1F is a schematic diagram illustrating an example of a step of manufacturing the semiconductor device according to the first embodiment of the present disclosure.
Figure 1G:
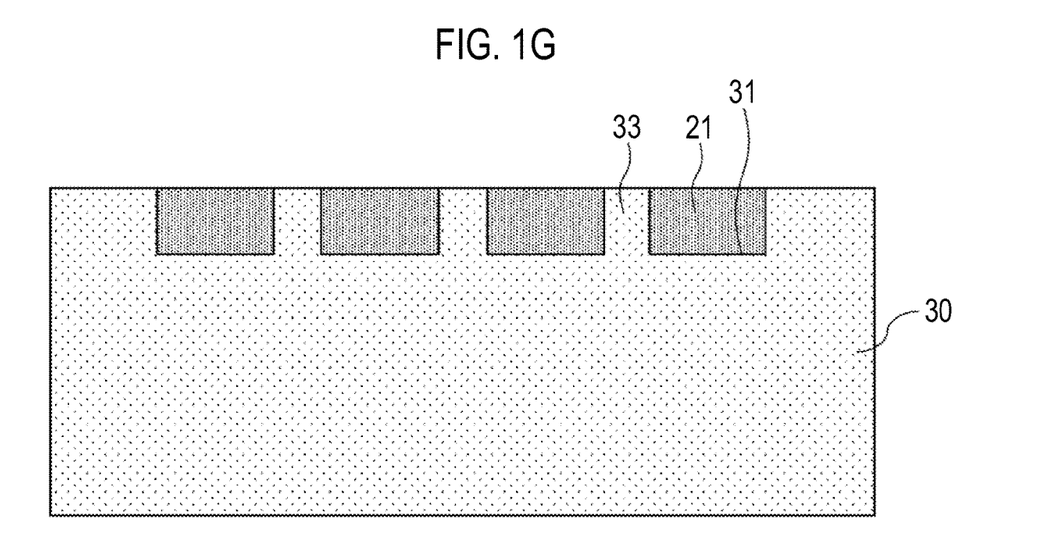
FIG. 1G is a schematic diagram illustrating an example of a step of manufacturing the semiconductor device according to the first embodiment of the present disclosure.

First, as illustrated in FIG. 1C, masking 100 is formed on the n-type gallium oxide semiconductor layer 30 illustrated in FIG. 1B. Next, as illustrated in 1D, a trench structure 31 is formed on the first surface side of the n-type gallium oxide semiconductor layer 30 by etching, and the masking 100 is removed as illustrated in FIG. 1E. Next, as illustrated in FIG. 1F, p-type semiconductor layers 21, 23 are deposited. Here, as illustrated in FIG. 1G, among the p-type semiconductor layers 21, 23, the p-type semiconductor layers 21 deposited on recessed portions of the trench structure 31 remain, and the p-type semiconductor layers 23 deposited on protrusion portions 33 of the trench structure 31 are removed. Finally, the first electrode layer 10 is disposed on the first surface of the n-type gallium oxide semiconductor layer 30, that is, on the surface on the side where the p-type semiconductor layers 21 are stacked, and the second electrode layer 40 is disposed on the second surface of the n-type gallium oxide semiconductor layer 30. As a result, the semiconductor device 1 illustrated in FIG. 1A is formed.

FIGS. 1B to 1F are not intended to limit the semiconductor device according to the present disclosure.

In addition, the masking process, the etching process, and the deposition of the p-type semiconductor layers can be adopted using any method used for manufacturing a semiconductor device.

Second Embodiment

In a semiconductor device according to a second embodiment of the present disclosure, based on the first embodiment of the present disclosure, the n-type gallium oxide semiconductor layer has a plurality of trench structures on the side where the p-type semiconductor layers are stacked. Here, the p-type semiconductor layers include: a first p-type semiconductor layer that is stacked in recessed portions of the trench structures to have a thickness less than a depth of the recessed portions; and a second p-type semiconductor layer that is stacked on protrusion portions between the trench structures. In addition, among the p-type semiconductor layers, the first p-type semiconductor layer and the second p-type semiconductor layer are most adjacent to each other. The first electrode layer is stacked such that the first electrode layer in contact with the first p-type semiconductor layer and the second p-type semiconductor layer and is in contact with the n-type gallium oxide semiconductor layer on side surfaces of the trench structures.

Figure 2A:
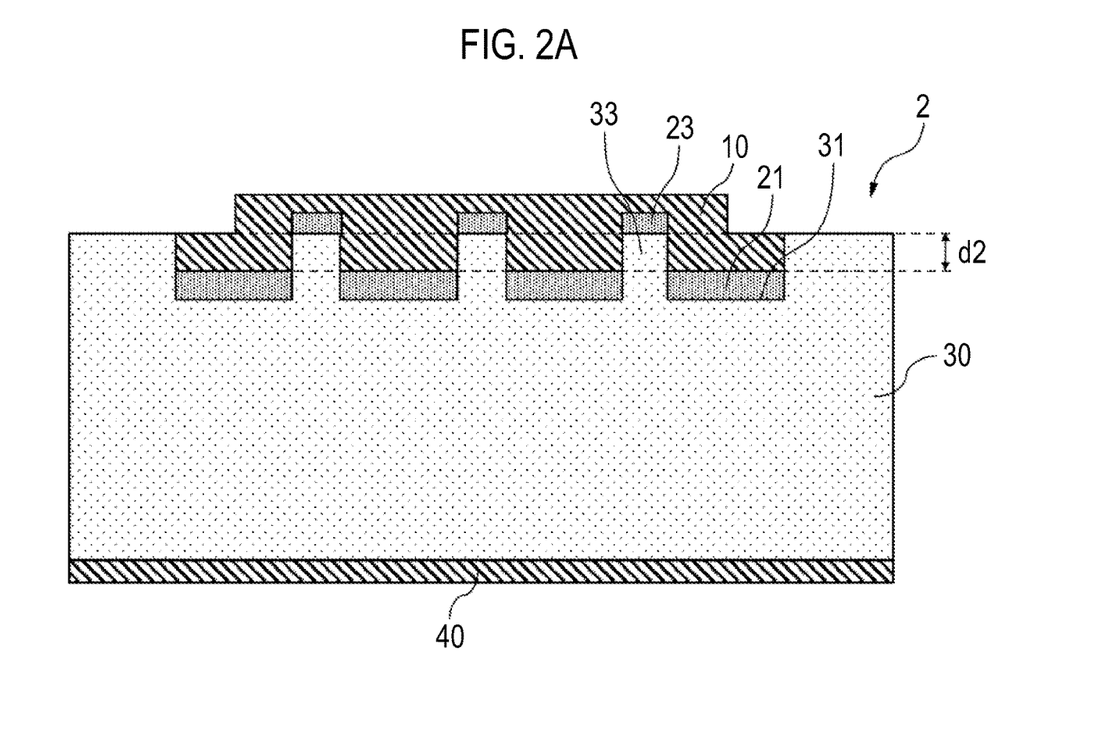
FIG. 2A is a schematic diagram illustrating a semiconductor device according to a second embodiment of the present disclosure.

More specifically, the semiconductor device according to the second embodiment of the present disclosure has, for example, a structure illustrated in FIG. 2A.

FIG. 2A is a schematic diagram illustrating a semiconductor device 2 according to the second embodiment of the present disclosure.

As illustrated in FIG. 2A, in the semiconductor device 2 according to the second embodiment of the present disclosure, the n-type gallium oxide semiconductor layer 30 has a plurality of trench structures 31 on the side where the p-type semiconductor layers 21, 23 are stacked. The p-type semiconductor layers 21, 23 include: a first p-type semiconductor layer 21 that is stacked in recessed portions of the trench structures 31 to have a thickness less than a depth of the recessed portions; and a second p-type semiconductor layer 23 that is stacked on protrusion portions 33 between the trench structures 31. Here, among the p-type semiconductor layers 21, 23, the first p-type semiconductor layer 21 and the second p-type semiconductor layer 23 are most adjacent to each other. The first electrode layer 10 is stacked such that the first electrode layer in contact with the first p-type semiconductor layer 21 and the second p-type semiconductor layer 23 and is in contact with the n-type gallium oxide semiconductor layer 30 on side surfaces of the trench structures 31.

In FIG. 2A, a shortest distance d2 between the first p-type semiconductor layer 21 and the second p-type semiconductor layer 23 is 0.4 μm to 1.0 μm.

When a semiconductor device including a p-type semiconductor layer formed of a different material from that of the n-type gallium oxide semiconductor layer is formed, the formation of the p-type semiconductor layer by implanting ions into the n-type gallium oxide semiconductor layer cannot be performed. In this case, the manufacturing of the semiconductor device 1 having the configuration illustrated in 1A using the method illustrated in FIGS. 1B to 1G can be considered.

In the configuration illustrated in FIG. 1A, in order to simultaneously achieve the improvement of voltage resistance and the reduction in resistance, the width of the protrusion portions 33 between the trench structures 31 needs to be 0.4 μm to 1.0 μm during the formation.

However, in order to form the trench structures 31 at this narrow width, fine processing is needed.

Regarding this point, the semiconductor device 2 according to the second embodiment of the present disclosure includes, as the two p-type semiconductor layers 21, 23 that are most adjacent to each other: a first p-type semiconductor layer 21 that is stacked in recessed portions of the trench structures 31 to have a thickness less than a depth of the recessed portions; and a second p-type semiconductor layer 23 that is stacked on protrusion portions 33 between the trench structures 31. Therefore, the shortest distance d2 between the p-type semiconductor layers 21, 23 that are most adjacent to each other is the length in a thickness direction of the semiconductor device.

Accordingly, in the semiconductor device 2 according to the second embodiment of the present disclosure, the shortest distance d2 can be adjusted by adjusting the depth of the trench structures 31 and/or the thickness of the first p-type semiconductor layer 21. As a result, the semiconductor device in which the distance d2 between the two p-type semiconductor layers 21, 23 that are most adjacent to each other is 0.4 μm to 1.0 μm can be manufactured using a simpler method.

Figure 2B:
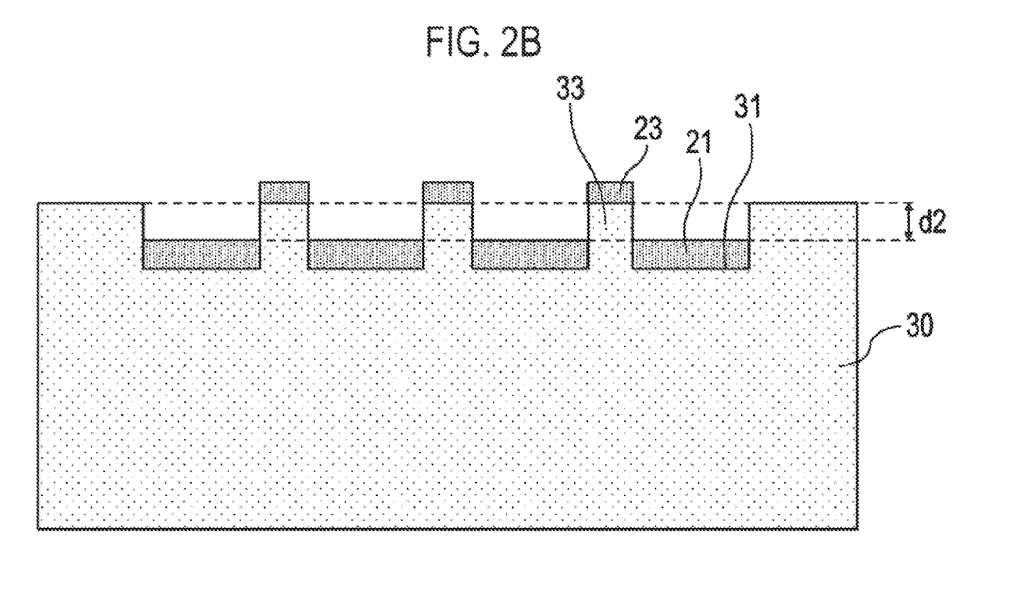
FIG. 2B is a schematic diagram illustrating an example of a step of manufacturing the semiconductor device according to the second embodiment of the present disclosure.

The semiconductor device 2 according to the second embodiment of the present disclosure can be formed, for example, as illustrated in FIGS. 1B to 1E and 2B. Specifically, after etching the n-type gallium oxide semiconductor layer 30 as illustrated in FIGS. 1B to 1E, as illustrated in FIG. 2B, the first p-type semiconductor layer 21 and the second p-type semiconductor layer 23 are stacked on the first surface of the n-type gallium oxide semiconductor layer 30, that is, the surface where the trench structures are formed. Finally, the first electrode layer 10 is disposed on the first surface of the n-type gallium oxide semiconductor layer 30, that is, on the surface on the side where the first p-type semiconductor layer 21 and the second p-type semiconductor layer 23 are stacked, and the second electrode layer 40 is disposed on the second surface of the n-type gallium oxide semiconductor layer 30. As a result, the semiconductor device 2 illustrated in FIG. 2A is formed.

FIGS. 2A and 2B are not intended to limit the semiconductor device according to the present disclosure.

Here, a positional relationship where each of a first depletion layer and a second depletion layer is formed can be controlled based on the size of the shortest distance between the first p-type semiconductor layer and the second p-type semiconductor layer adjacent to each other. In addition, the size of the depletion layer can be controlled based on the doping concentration in the n-type gallium oxide semiconductor layer.

Accordingly, a shortest distance between the first p-type semiconductor layer and the second p-type semiconductor layer adjacent to each other and a doping concentration in the n-type gallium oxide semiconductor layer can be designed such that a first depletion layer and a second depletion layer that are formed in a state where a potential of the first electrode layer relative to the second electrode layer are connected to each other, the first depletion layer being formed between the first p-type semiconductor layer and the n-type gallium oxide semiconductor layer is 0 V, and the second depletion layer being formed between the second p-type semiconductor layer and the n-type gallium oxide semiconductor layer.

Third Embodiment

Based on the second embodiment of the present disclosure, a semiconductor device according to a third embodiment of the present disclosure further includes a peripheral voltage withstanding structure including a plurality of trench structures. In the semiconductor device according to the third embodiment of the present disclosure, the peripheral voltage withstanding structure includes: a third p-type semiconductor layer that is stacked in the recessed portions of the trench structures to have a thickness less than the depth of the recessed portions; and a fourth p-type semiconductor layer that is stacked on the protrusion portions between the trench structures. In addition, among the p-type semiconductor layers, the third p-type semiconductor layer and the fourth p-type semiconductor layer are most adjacent to each other.

A plurality of the third p-type semiconductor layers may include two or more third p-type semiconductor layers having different thicknesses. That is, two or more combinations of the third p-type semiconductor layers and the fourth p-type semiconductor layers in which the shortest distances between the third p-type semiconductor layers and the fourth p-type semiconductor layers are different can be made to be present.

In particular, a shortest distance between the third p-type semiconductor layer and the fourth p-type semiconductor layer that are most adjacent to each other increases in a direction from a center side to an outer side of the semiconductor device. The center side of the semiconductor device is a side where the first electrode layer is disposed. That is, in other words, the peripheral voltage withstanding structure the shortest distance between the third p-type semiconductor layer and the fourth p-type semiconductor layer increases in a direction from the side close to the first electrode layer to the side far from the first electrode layer.

Figure 3:
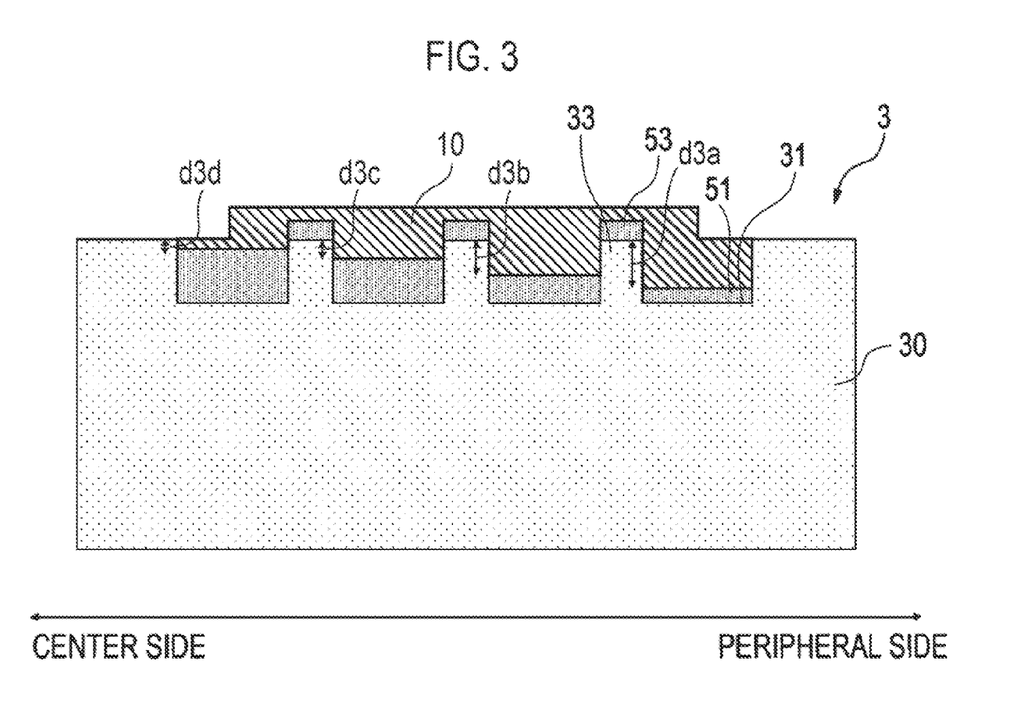
FIG. 3 is a schematic diagram illustrating a peripheral voltage withstanding structure of a semiconductor device according to a third embodiment of the present disclosure.

FIG. 3 is a schematic diagram illustrating a peripheral voltage withstanding structure 3 of the semiconductor device according to the third embodiment of the present disclosure.

As illustrated in FIG. 3, the peripheral voltage withstanding structure 3 includes the trench structures 31. The peripheral voltage withstanding structure 3 includes a third p-type semiconductor layer 51 and a fourth p-type semiconductor layer 53. The third p-type semiconductor layer 51 is stacked in the recessed portions of the trench structures 31 to have a thickness less than the depth of the recessed portions. The fourth p-type semiconductor layer 53 is stacked on the protrusion portions 33 between the trench structures 31. Here, among the p-type semiconductor layers 51, 53, the third p-type semiconductor layer 51 and the fourth p-type semiconductor layer 53 are most adjacent to each other.

Here, as illustrated in FIG. 3, in the peripheral voltage withstanding structure 3, the thickness of the third p-type semiconductor layer 51 decreases in a direction from the center side to the outer side. As a result, in the peripheral voltage withstanding structure 3, the shortest distance between the third p-type semiconductor layer 51 and the fourth p-type semiconductor layer 53 increases in order of d3a to d3d in the direction from the center side to the outer side.

FIG. 3 is not intended to limit the semiconductor device according to the present disclosure.

REFERENCE EXAMPLES 1 TO 10

Reference Example 1

JBS diodes, that is, semiconductor devices according to Reference Examples 1 to 10 were prepared using SiC. The doping concentration in a n-type semiconductor layer was $2.4 \times 10^{16}$ cm$^{-3}$. P-type semiconductor layers were formed by implanting Al ions ($1 \times 10^{19}$ cm$^{-3}$) as an acceptor into SiC. A shortest distance (pitch) between two p-type semiconductor layers that are most adjacent to each other among the p-type semiconductor layers was 1.0 μm.

Specifically, the semiconductor devices were formed using a method illustrated in FIGS. 4A to 4E.

Figure 4A:
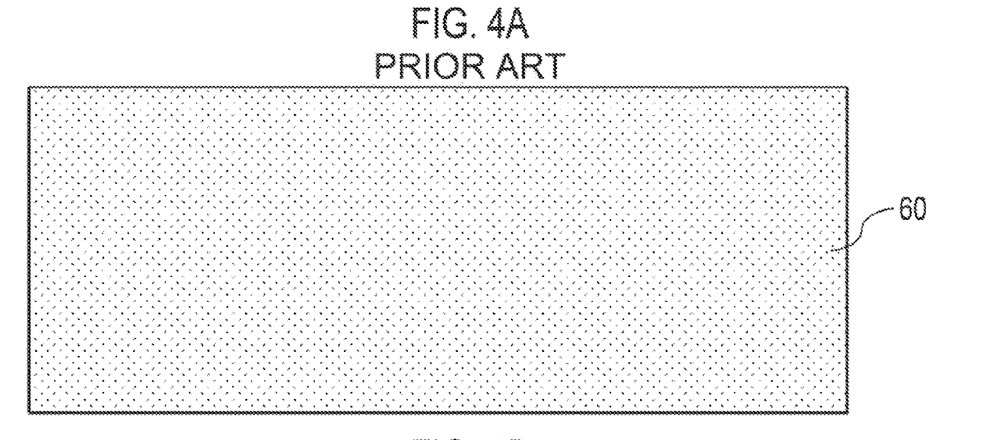
FIG. 4A is a schematic diagram illustrating an example of a step of manufacturing a semiconductor device according to Reference Example 1.
Figure 4B:
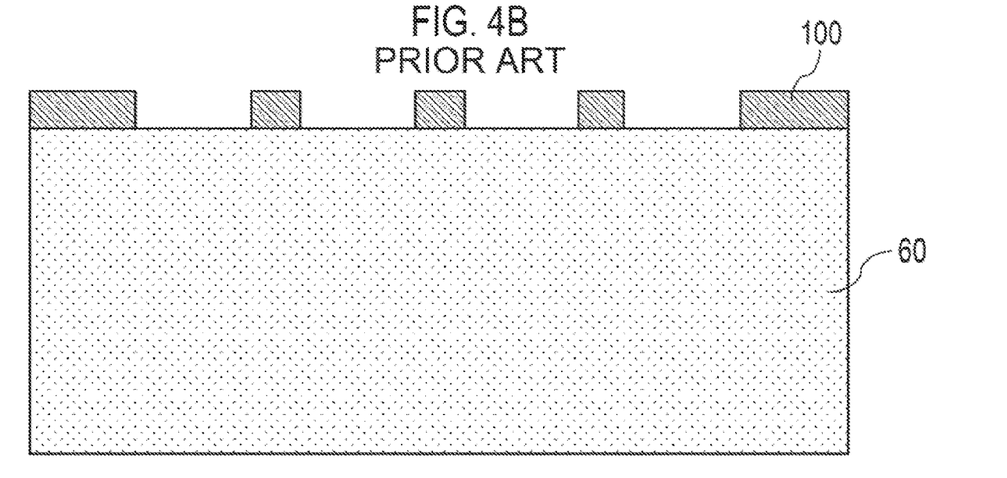
FIG. 4B is a schematic diagram illustrating an example of a step of manufacturing the semiconductor device according to Reference Example 1.
Figure 4C:
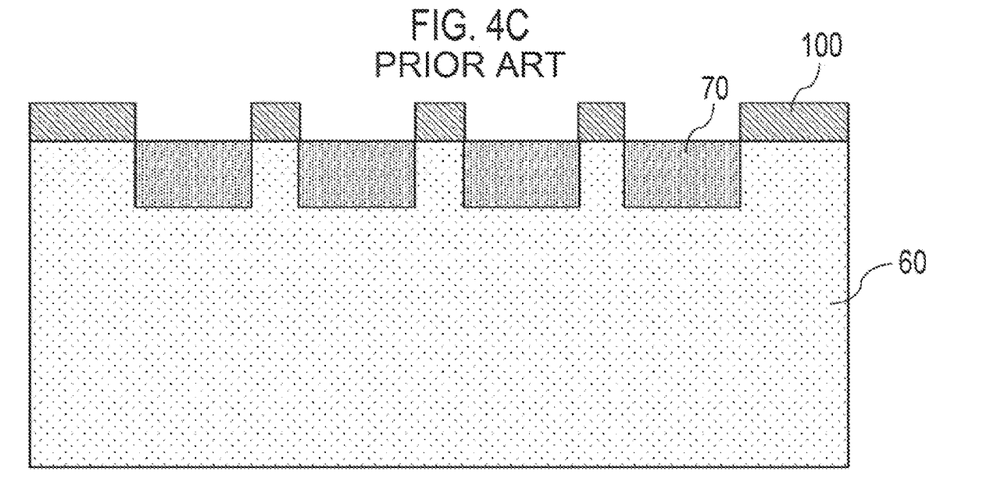
FIG. 4C is a schematic diagram illustrating an example of a step of manufacturing the semiconductor device according to Reference Example 1.
Figure 4D:
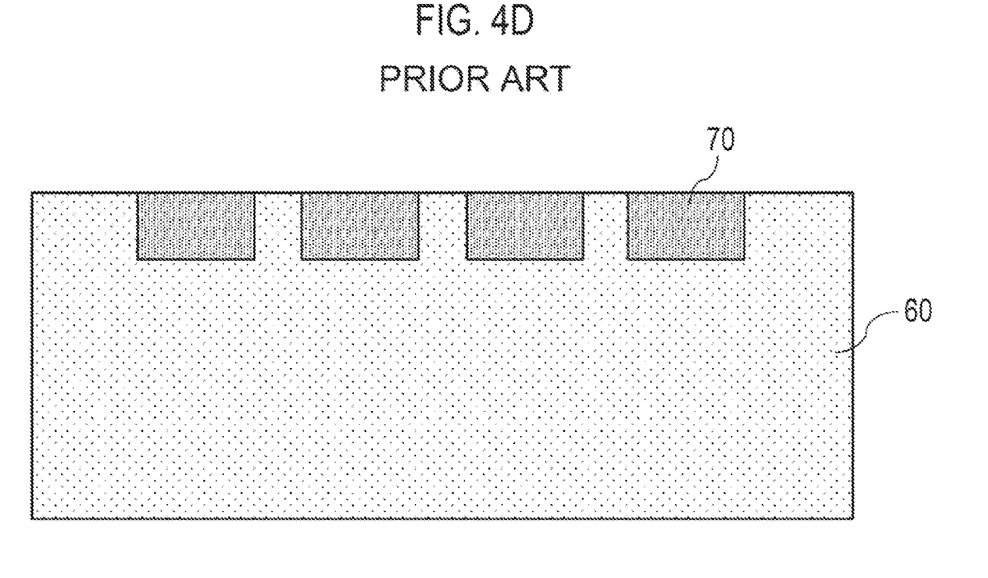
FIG. 4D is a schematic diagram illustrating an example of a step of manufacturing the semiconductor device according to Reference Example 1.
Figure 4E:
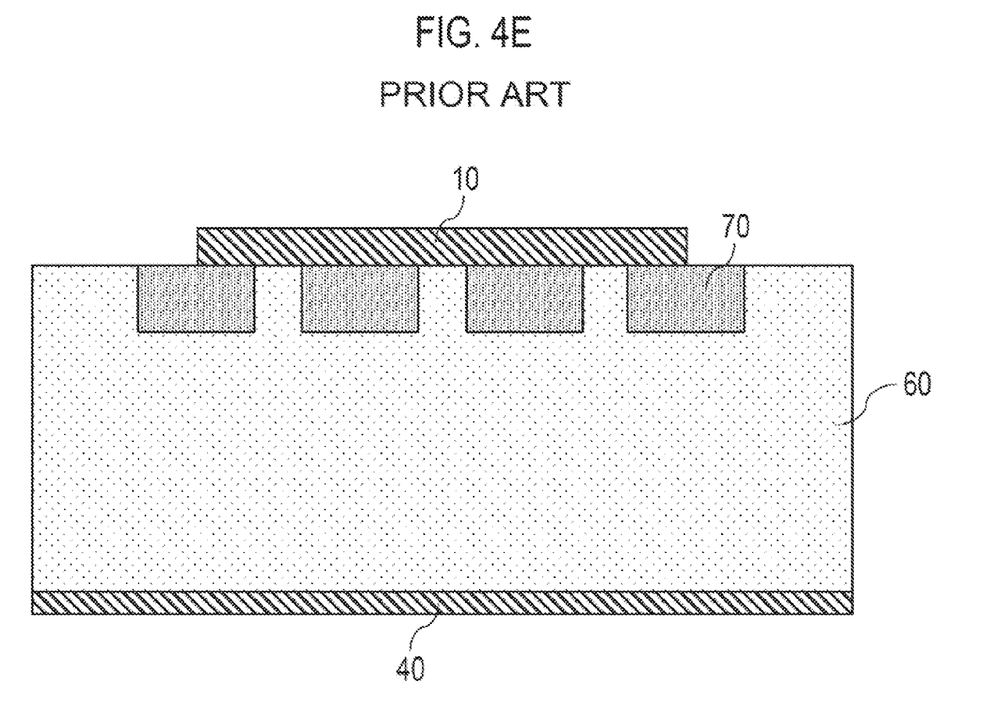
FIG. 4E is a schematic diagram illustrating an example of a step of manufacturing the semiconductor device according to Reference Example 1.

That is, as illustrated in FIG. 4A, an n-type semiconductor layer 60 was formed by doping SiC with a dopant. Next, as illustrated in FIG. 4B, masking 100 is formed at regular intervals on a first surface of the n-type semiconductor layer 60. Next, as illustrated in FIG. 4C, a plurality of p-type semiconductor layers 70 were formed by implanting Al ions. Next, as illustrated in FIG. 4D, the masking 100 is removed from the first surface of the n-type semiconductor layer 60. Finally, as illustrated in FIG. 4E, a first electrode layer 10 and a second electrode layer 40 are disposed on both surfaces of the n-type semiconductor layer 60.

Table 1 shows a configuration of Reference Example 1.

Reference Examples 2 to 10

Semiconductor devices according to Reference Examples 2 to 10 were prepared using the same method as that of Reference Example 1, except that the shortest distances (pitches) between two p-type semiconductor layers that were most adjacent to each other among the p-type semiconductor layers were changed to 2.0 μm, 3.0 μm, 4.0 μm, 5.0 μm, 7.0 μm, 8.0 μm, 9.0 μm, 10.0 μm, and 12.0 μm, respectively.

Table 1 shows configurations of Reference Examples 2 to 10.

Test

A current was caused to flow in a forward direction between the electrode layers of the semiconductor device in each of the examples, and a voltage value (V) between the electrode layers at which the current was 1.0 mA was measured. In addition, an on-resistance at 100 A/cm$^2$ was measured.

Table 1 shows the test result of each of the examples.

Result

Table 1 shows the configurations and the test results of the semiconductor devices according to Reference Examples 1 to 10. In addition, FIG. 5 is a graph illustrating a relationship between withstand voltages and the lengths of pitches in the semiconductor devices according to Reference Examples 1 to 10.

TABLE 1

| | Configuration | | | Result | |
| --- | --- | --- | --- | --- | --- |
| | N-Type Semiconductor Layer | Acceptor | Pitch (μm) | Withstand Voltage (V) | On-Resistance (mΩ/cm$^2$) |
| Reference Example 1 | SiC | Al | 1 | 567 | 6.60 |
| Reference Example 2 | SiC | Al | 2 | 498 | 6.19 |
| Reference Example 3 | SiC | Al | 3 | 343 | 5.82 |
| Reference Example 4 | SiC | Al | 4 | 220 | 6.11 |
| Reference Example 5 | SiC | Al | 5 | 190 | 5.38 |
| Reference Example 6 | SiC | Al | 7 | 208 | 5.75 |
| Reference Example 7 | SiC | Al | 8 | 212 | 5.47 |
| Reference Example 8 | SiC | Al | 9 | 152 | 5.59 |
| Reference Example 9 | SiC | Al | 10 | 152 | 5.43 |
| Reference Example 10 | SiC | Al | 12 | 149 | 5.49 |

Figure 5:
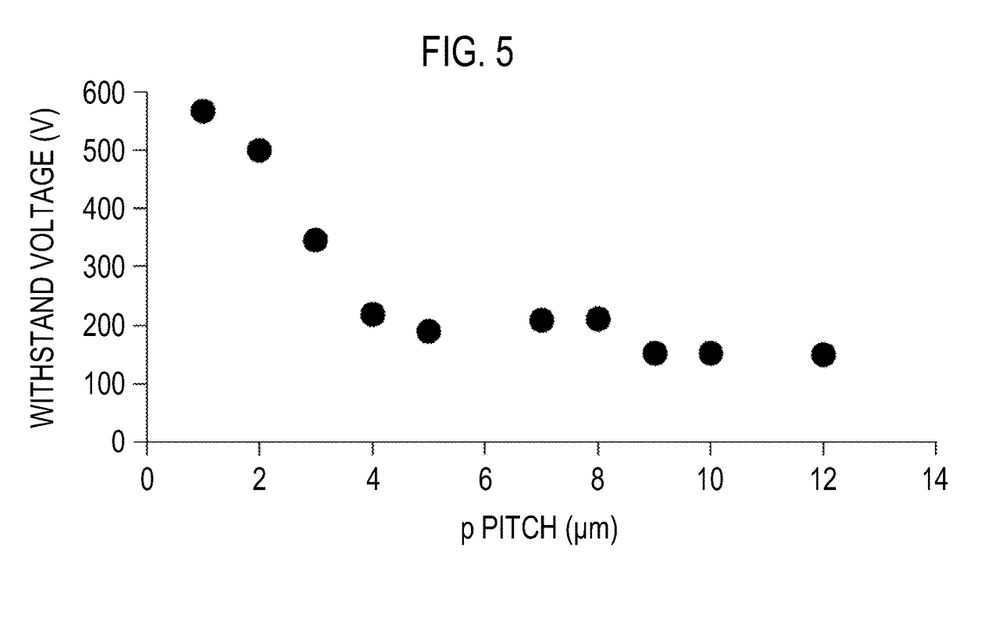
FIG. 5 is a graph illustrating a relationship between withstand voltages and the lengths of pitches in semiconductor devices according to Reference Examples 1 to 10.

As shown in Table 1 and FIG. 5, as the pitch, that is, the shortest distance between two p-type semiconductor layers that were most adjacent to each other among the p-type semiconductor layers decreased, the withstand voltage increased, and the on-resistance also increased.

EXAMPLES 1 TO 5 AND COMPARATIVE EXAMPLES 1 TO 8

Example 1

A semiconductor device according to Example 1 was prepared with the method illustrated in FIGS. 1A to 1G using the n-type gallium oxide semiconductor layer (dope concentration: $5 \times 10^{17}$ cm$^{-3}$) and NiO as the p-type semiconductor layer.

Specifically, as illustrated in FIG. 1C, the masking 100 was formed on the n-type gallium oxide semiconductor layer 30 illustrated in FIG. 1B. Next, as illustrated in 1D, the trench structure 31 was formed on the first surface side of the n-type gallium oxide semiconductor layer 30 by etching, and the masking 100 was removed as illustrated in FIG. 1E. Next, as illustrated in FIG. 1F, the p-type semiconductor layers 21, 23 were deposited. Here, as illustrated in FIG. 1G, among the p-type semiconductor layers 21, 23, the p-type semiconductor layers 21 deposited on the recessed portions of the trench structure 31 remained, and the p-type semiconductor layers 23 deposited on protrusion portions 33 of the trench structure 31 were removed. Finally, the first electrode layer 10 was disposed on the first surface of the n-type gallium oxide semiconductor layer 30, that is, on the surface on the side where the p-type semiconductor layers 21 were stacked, and the second electrode layer 40 was disposed on the second surface of the n-type gallium oxide semiconductor layer 30. As a result, the semiconductor device 1 illustrated in FIG. 1A was formed.

Here, the pitch, that is, the shortest distance d1 between two p-type semiconductor layers 21 that were most adjacent to each other among the p-type semiconductor layers 21 was 0.4 µm.

Table 2 shows a configuration of Example 1.

Examples 2 to 4

Semiconductor devices according to Examples 2 to 4 were prepared using the same method as that of Example 1, except that the pitches, that is, the shortest distances (pitches) between two p-type semiconductor layers that were most adjacent to each other among the p-type semiconductor layers were changed to 0.5 µm, 0.7 µm, and 1.0 µm, respectively.

Table 2 shows configurations of Examples 2 to 4.

Example 5

A semiconductor device according to Example 5 was prepared with the method illustrated in FIGS. 1B to 1E and 2B using the n-type gallium oxide semiconductor layer (dope concentration: $5\times10^{17}$ cm$^{-3}$) and NiO as the p-type semiconductor layer.

Specifically, after etching the n-type gallium oxide semiconductor layer 30 as illustrated in FIGS. 1B to 1E, as illustrated in FIG. 2B, the first p-type semiconductor layer 21 and the second p-type semiconductor layer 23 were stacked on the first surface of the n-type gallium oxide semiconductor layer 30, that is, the surface where the trench structures 31 were formed. Finally, the first electrode layer 10 was disposed on the first surface of the n-type gallium oxide semiconductor layer 30, that is, on the surface on the side where the p-type semiconductor layers 21, 23 were stacked, and the second electrode layer 40 was disposed on the second surface of the n-type gallium oxide semiconductor layer 30.

Here, the pitch, that is, the shortest distance d2 between the first p-type semiconductor layer 21 and the second p-type semiconductor layer 23 was 1.0 µm. Unlike Examples 1 to 4, the pitch in the Example 5 was the distance between the first p-type semiconductor layer 21 and the second p-type semiconductor layer 23 in the thickness direction of the semiconductor device 2.

Table 2 shows a configuration of Example 5.

Test

A current was caused to flow in a forward direction between the electrode layers of the semiconductor device in each of the examples, and a voltage value (V) between the electrode layers at which the current was 1.0 mA was measured. In addition, an on-resistance at 100 A/cm$^2$ was measured.

Table 2 shows the test result of each of the examples.

Comparative Examples 1 to 8

Semiconductor devices according to Comparative Examples 1 to 8 were prepared using the same method as that of Reference Example 1, except that the pitches, that is, the shortest distances between two p-type semiconductor layers that were most adjacent to each other among the p-type semiconductor layers were changed to 0.2 µm, 0.3 µm, 1.5 µm, 2.0 µm, 2.5 µm, 3.0 µm, 3.5 µm, and 4.0 µm, respectively.

Table 2 shows configurations of Comparative Examples 1 to 8.

Result

Table 2 shows the configurations and the test results of the semiconductor devices according to Examples 1 to 5 and Comparative Examples 1 to 8. In addition, FIG. 6 is a graph illustrating a relationship between withstand voltages and the lengths of pitches in the semiconductor devices according to Examples 1 to 5 and Comparative Examples 1 to 8.

TABLE 2

| | Configuration | | | Result | |
|---|---|---|---|---|---|
| | N-Type Semiconductor Layer | P-Type Semiconductor Layer | Pitch (µm) | Withstand Voltage (V) | On-Resistance (mΩ/cm$^2$) |
| Comparative Example 1 | Ga$_2$O$_3$ | NiO | 0.2 | 326 | 4.72 |
| Comparative Example 2 | Ga$_2$O$_3$ | NiO | 0.3 | 319 | 4.26 |
| Example 1 | Ga$_2$O$_3$ | NiO | 0.4 | 311 | 4.03 |
| Example 2 | Ga$_2$O$_3$ | NiO | 0.5 | 302 | 4.15 |
| Example 3 | Ga$_2$O$_3$ | NiO | 0.7 | 282 | 4.13 |
| Example 4 | Ga$_2$O$_3$ | NiO | 1.0 | 256 | 4.07 |
| Example 5 | Ga$_2$O$_3$ | NiO | 1.0 (Thickness Direction) | 239 | 4.09 |
| Comparative Example 3 | Ga$_2$O$_3$ | NiO | 1.5 | 241 | 3.65 |
| Comparative Example 4 | Ga$_2$O$_3$ | NiO | 2.0 | 239 | 3.64 |
| Comparative Example 5 | Ga$_2$O$_3$ | NiO | 2.5 | 239 | 3.23 |
| Comparative Example 6 | Ga$_2$O$_3$ | NiO | 3.0 | 205 | 3.21 |
| Comparative Example 7 | Ga$_2$O$_3$ | NiO | 3.5 | 109 | 3.49 |
| Comparative Example 8 | Ga$_2$O$_3$ | NiO | 4.0 | 109 | 3.09 |

Figure 6:
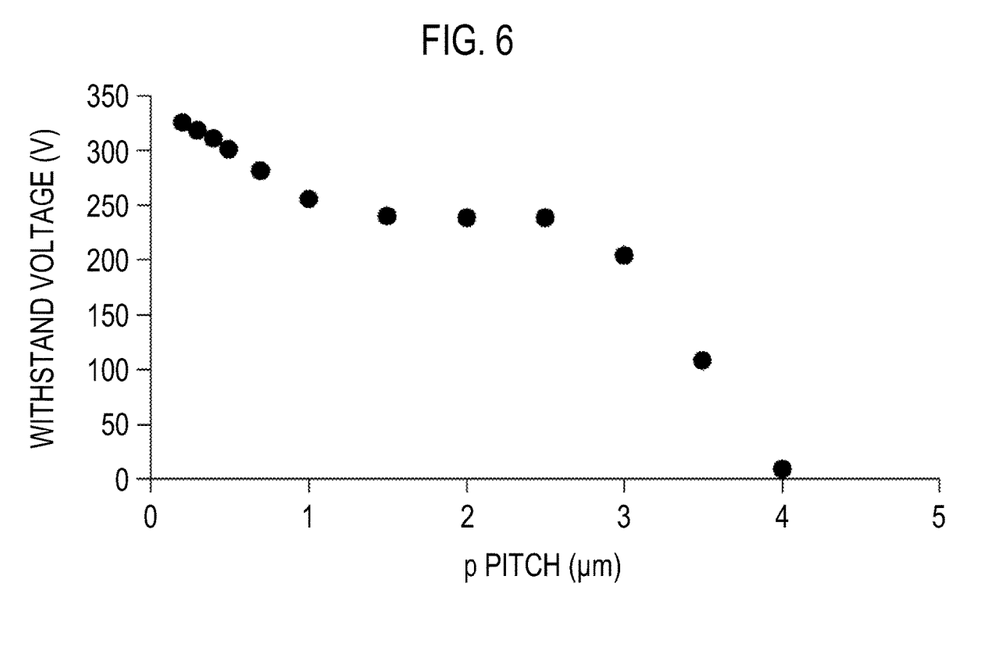
FIG. 6 is a graph illustrating a relationship between withstand voltages and the lengths of pitches in semiconductor devices according to Examples 1 to 5 and Comparative Examples 1 to 8.

As shown in Table 2 and FIG. 6, as the pitch, that is, the shortest distance between two p-type semiconductor layers that were most adjacent to each other among the p-type semiconductor layers decreased, the withstand voltage increased, and the on-resistance also increased.

In addition, as shown in Table 2 and FIG. 6, as Examples 1 to 5 where the pitch was 1.0 µm or more were compared to Comparative Examples 3 to 8 where the pitch was more than 1.0 µm, it was found that the withstand voltage increased rapidly when the pitch was 1.0 µm or less. On the other hand, as shown in Table 2 and FIG. 6, as Examples 1 to 5 where the pitch was 1.0 µm or more were compared to Comparative Examples 1 and 2 where the pitch was less than 0.4 µm, it was found that an increase in on-resistance relative to an increase in withstand voltage increased rapidly when the pitch was less than 0.4 μm.

What is claimed is:

1. A semiconductor device comprising a first electrode layer, a plurality of p-type semiconductor layers, an n-type gallium oxide semiconductor layer, and a second electrode layer, wherein:
   the p-type semiconductor layers are stacked on a first surface side of the n-type gallium oxide semiconductor layer such that the p-type semiconductor layers are in contact with the n-type gallium oxide semiconductor layer;
   the first electrode layer is stacked on the first surface side of the n-type gallium oxide semiconductor layer such that the first electrode layer is in contact with the p-type semiconductor layers and is in contact with the n-type gallium oxide semiconductor layer in a portion where the p-type semiconductor layers are distant from each other;
   the second electrode layer is stacked on a second surface side of the n-type gallium oxide semiconductor layer such that the second electrode layer is in contact with the n-type gallium oxide semiconductor layer;
   a shortest distance between two of the plurality of p-type semiconductor layers that are most adjacent to each other among the p-type semiconductor layers is from 0.4 μm to 1.0 μm; wherein:
   the n-type gallium oxide semiconductor layer has a plurality of trench structures on a side where the p-type semiconductor layers are stacked;
   the p-type semiconductor layers include
      a first p-type semiconductor layer that is stacked in recessed portions of the trench structures and has a thickness that is less than a depth of the recessed portions, and
      a second p-type semiconductor layer that is stacked on protrusion portions between the trench structures;
   the first p-type semiconductor layer and the second p-type semiconductor layer are most adjacent to each other; and
   the first electrode layer is stacked such that the first electrode layer in contact with the first p-type semiconductor layer and the second p-type semiconductor layer and is in contact with the n-type gallium oxide semiconductor layer on side surfaces of the trench structures.

2. The semiconductor device according to claim 1, wherein:
   a first depletion layer and a second depletion layer are connected to each other in a state where a potential of the first electrode layer relative to the second electrode layer is 0 V, the first depletion layer being provided between the first p-type semiconductor layer and the n-type gallium oxide semiconductor layer, and the second depletion layer being provided between the second p-type semiconductor layer and the n-type gallium oxide semiconductor layer; and
   the second electrode layer is an ohmic electrode.

3. The semiconductor device according to claim 1, wherein the first p-type semiconductor layer includes two or more portions each of which has different thicknesses from each other and is stacked in each recessed portion of the trench structures.

4. The semiconductor device according to claim 1, wherein a shortest distance between the first p-type semiconductor layer and the second p-type semiconductor layer that are most adjacent to each other increases in a direction from a center side to an outer side of the semiconductor device.

5. The semiconductor device according to claim 1, wherein the n-type gallium oxide semiconductor layer is a gallium oxide substrate having a doping concentration of $3 \times 10^{17}$ cm$^{-3}$ or more.

6. A semiconductor device comprising a first electrode layer, a plurality of p-type semiconductor layers, an n-type gallium oxide semiconductor layer, and a second electrode layer, wherein:
   the p-type semiconductor layers are stacked on a first surface side of the n-type gallium oxide semiconductor layer such that the p-type semiconductor layers are in contact with the n-type gallium oxide semiconductor layer;
   the first electrode layer is stacked on the first surface side of the n-type gallium oxide semiconductor layer such that the first electrode layer is in contact with the p-type semiconductor layers and is in contact with the n-type gallium oxide semiconductor layer in a portion where the p-type semiconductor layers are distant from each other;
   the second electrode layer is stacked on a second surface side of the n-type gallium oxide semiconductor layer such that the second electrode layer is in contact with the n-type gallium oxide semiconductor layer;
   a shortest distance between two of the plurality of p-type semiconductor layers that are most adjacent to each other among the p-type semiconductor layers is from 0.4 μm to 1.0 μm;
   the n-type gallium oxide semiconductor layer has a plurality of trench structures on a side where the p-type semiconductor layers are stacked;
   the p-type semiconductor layers include
      a first p-type semiconductor layer that is stacked in recessed portions of the trench structures to have a thickness that is less than a depth of the recessed portions, and
      a second p-type semiconductor layer that is stacked on protrusion portions between the trench structures;
   the first electrode layer is stacked such that the first electrode layer in contact with the first p-type semiconductor layer and the second p-type semiconductor layer and is in contact with the n-type gallium oxide semiconductor layer on side surfaces of the trench structures.

* * * * *